(12) United States Patent
Haugan (10) Patent No.: US 10,651,838 B2
(45) Date of Patent: May 12, 2020

(54) DC POWER SWITCHING ASSEMBLY AND METHOD

(71) Applicant: Siemens Aktiengesellschaft, Munich (DE)

(72) Inventor: Espen Haugan, Trondheim (NO)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 16/476,281

(22) PCT Filed: Jan. 10, 2018

(86) PCT No.: PCT/EP2018/050540
§ 371 (c)(1),
(2) Date: Jul. 6, 2019

(87) PCT Pub. No.: WO2018/130557
PCT Pub. Date: Jul. 19, 2018

(65) Prior Publication Data
US 2019/0363707 A1    Nov. 28, 2019

(30) Foreign Application Priority Data

Jan. 13, 2017  (EP) ..................... 17151370

(51) Int. Cl.
*H02J 3/36* (2006.01)
*H03K 17/10* (2006.01)
(Continued)

(52) U.S. Cl.
CPC ........... *H03K 17/107* (2013.01); *H02H 3/087* (2013.01); *H02H 7/268* (2013.01); *H02J 1/108* (2013.01);
(Continued)

(58) Field of Classification Search
CPC .... H02J 1/102; H02J 1/108; H02J 1/12; H02J 3/36; H02J 5/00; H02M 3/04; H02M 7/08;
(Continued)

(56) References Cited

U.S. PATENT DOCUMENTS 4,594,650 A    6/1986  Kinbara
5,953,222 A    9/1999  Mizutani
2018/0034280 A1 *  2/2018  Pedersen ................... H02J 3/30

FOREIGN PATENT DOCUMENTS

EP    2421140 A1    2/2012
EP    2869420 A1 *  5/2015  ................ H02J 3/04
(Continued)

OTHER PUBLICATIONS

International search report and written opinion dated Apr. 19, 2018 for corresponding PCT/EP2018/050540.

*Primary Examiner* — John W Poos
(74) *Attorney, Agent, or Firm* — Beusse Wolter Sanks & Maire (57) ABSTRACT

A DC power switching assembly includes a plurality of series connected power switching units. Each power switching unit has a first terminal of the unit and a second terminal of the unit, the terminals having the same polarity. A power switching sub-unit is electrically coupled between the first terminal and the second terminal of the unit to control current flow between the first terminal and the second terminal. The sub-unit has at least one semiconductor device, a current limiter and a pair of series connected diodes in parallel with the current limiter. The series connected diodes and current limiter are connected to one terminal of the semiconductor device; and a capacitor is connected to the other terminal of the semiconductor device.

11 Claims, 6 Drawing Sheets

(51) Int. Cl.
 *H02H 3/087* (2006.01)
 *H02H 7/26* (2006.01)
 *H03K 17/0814* (2006.01)
 *H02J 1/10* (2006.01)

(52) U.S. Cl.
 CPC .......... *H02J 3/36* (2013.01); *H03K 17/08148* (2013.01)

(58) Field of Classification Search
 CPC . H02M 7/44; H03K 17/107; H03K 17/08148; H03K 2217/0009
 USPC .............................................. 307/18, 22, 26
 See application file for complete search history.

(56) References Cited

FOREIGN PATENT DOCUMENTS

FR    2773010 A1    6/1999
WO    2012038101 A1    3/2012

* cited by examiner

DC POWER SWITCHING ASSEMBLY AND METHOD

CROSS REFERENCE TO RELATED APPLICATIONS

This application is the US National Stage of International Application No. PCT/EP2018/050540 filed Jan. 10, 2018, and claims the benefit thereof. The International Application claims the benefit of European Application No. EP17151370 filed Jan. 13, 2017. All of the applications are incorporated by reference herein in their entirety.

FIELD OF INVENTION

This invention relates to a DC power switching assembly, in particular for an offshore platform or vessel.

BACKGROUND OF INVENTION

On offshore platforms or vessels, drilling rigs, aircraft, HVDC systems, wind power grids, or similar DC systems, much equipment is deemed to be critical and regulatory requirements specify the availability of power in the event of a fault. Consequentially, it has been normal practice to separate the equipment on the vessel, or rig, into sections and provide separate power to each section, with redundancy, so that if a fault occurs in one section, it does not transfer to the other and not all operational capability is lost. This separation has been achieved by operating with bus ties between the sections normally open and only in limited circumstances closing those bus ties to enable one side to receive power from the other. However, such bus ties are only available for low voltage DC systems. For high voltage systems, mechanical breakers must be used.

SUMMARY OF INVENTION

In accordance with a first aspect of the present invention a DC power switching assembly comprises a plurality of series connected power switching units; each power switching unit comprising a first terminal of the unit and a second terminal of the unit and a power switching sub-unit electrically coupled between the first terminal and the second terminal to control current flow between the first terminal and the second terminal; wherein the first terminal and the second terminal have the same polarity; wherein the sub-unit comprises at least one semiconductor device, which conducts in normal operation and no longer conducts in the event of a fault arising at one of the first and second terminals, a current limiter and a pair of series connected diodes in parallel with the current limiter, wherein the series connected diodes and current limiter are connected to one terminal of the semiconductor device; wherein the series connected diodes allow current flow to continue until the current limiter has discharged, if the semiconductor device no longer conducts; and wherein a capacitor is connected to the other terminal of the semiconductor device to block voltage when the semiconductor devices no longer conduct.

Advantageously, the power switching unit comprises two symmetrical power switching sub-units, each unit being connected on one side to one of the first and second power switching unit terminals and on the other side to the other sub-unit.

The capacitor may be connected in series with the semiconductor device, but advantageously, the capacitor is connected in parallel across the semiconductor device.

Advantageously, one or each of the sub-units further comprise a resistor in series with the capacitor.

This helps to limit system oscillations.

Advantageously, one or each of the sub-units further comprise a damping circuit in series with the capacitor.

This helps to limit system oscillations.

Advantageously, the semiconductor device comprises one of a diode, or a transistor.

Advantageously, the semiconductor device comprises an insulated gate bipolar transistor.

Advantageously, the current limiter comprises an inductance.

In accordance with a second aspect of the present invention, a DC power supply system comprises first and second DC power distribution bus sections and a DC power switching assembly according to the first aspect, wherein a first terminal of the assembly is electrically coupled to the first DC bus section of the power distribution bus and the second terminal is electrically coupled to the second DC bus section of the power distribution bus.

Advantageously, the voltage at one side of the power switching assembly is greater than or equal to 1 KV.

Advantageously, the voltage at one side of the power switching assembly is within the range 1 KV to 15 KV.

In accordance with a third aspect of the present invention, a method of operating a DC power switching assembly according to the first aspect or the second aspect comprises monitoring system voltage and current during operation; if a short circuit is detected, opening the power switching units to block current from the short circuit side of the system; monitoring for an indication that the short circuit has been cleared, closing the power switching units to allow current to pass through the power switching units; and continuing to monitor the system for indications of a short circuit.

BRIEF DESCRIPTION OF THE DRAWINGS

An example of a DC power switching assembly and method according to the present invention will now be described with reference to the accompany drawings in which.

DETAILED DESCRIPTION OF INVENTION

DC power distribution systems on offshore vessels, or platforms, or remote drilling rigs, typically comprise a power source such as a prime mover, a generator, or an energy store, together with DC bus sections which are joined by a bus tie switch. In order to meet regulatory requirements for safe operation, the bus tie switch must be able to disconnect the DC bus sections from one another to prevent a fault on one side of the system from propagating to the other side and potentially losing all power to critical systems, such as thrusters or essential parts of the drilling equipment.

Figure 1:
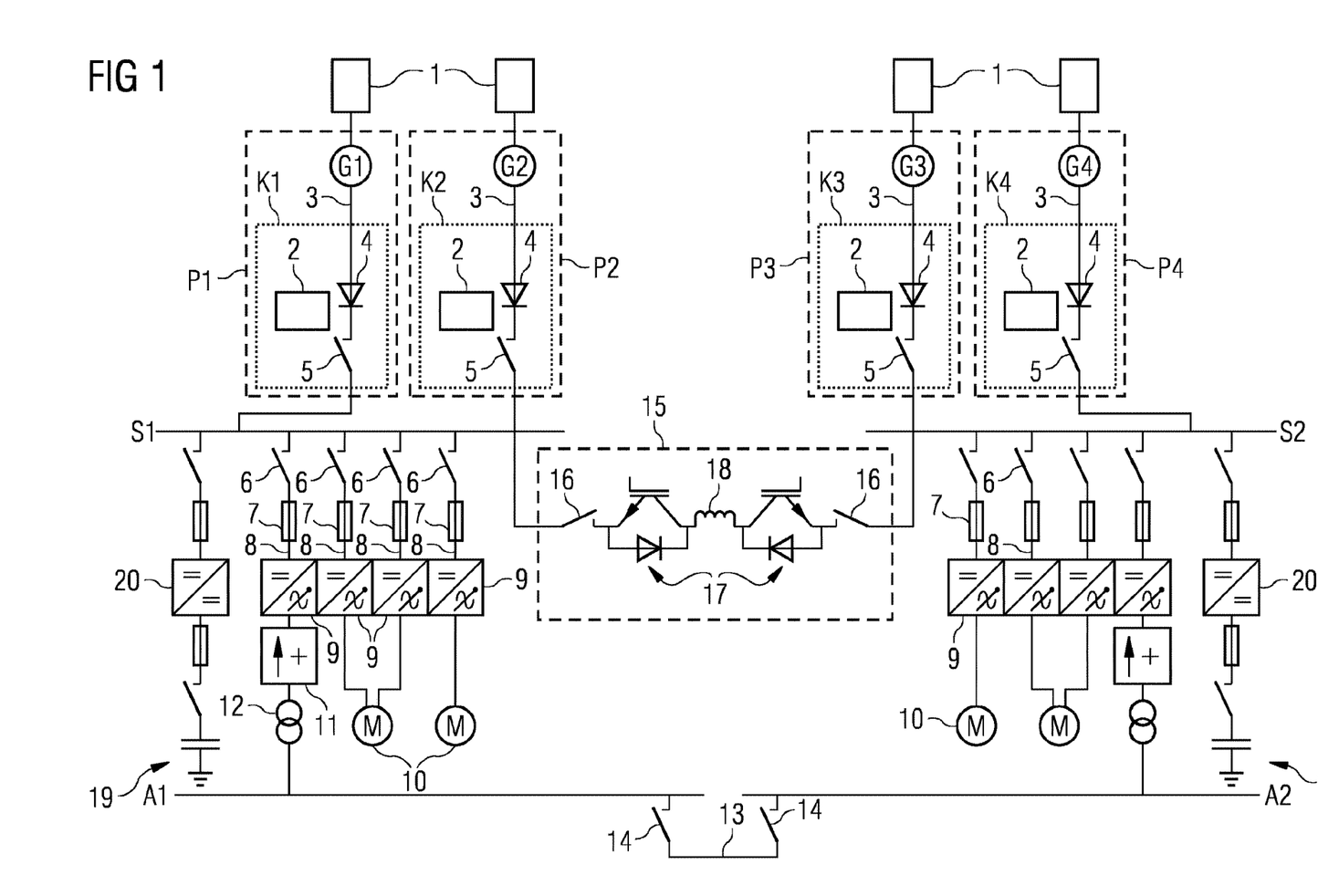
FIG. 1 illustrates an example of circuitry for a low voltage diesel electric propulsion system.

Typically, a bus tie switch or breaker function is provided for AC distribution (high and low voltage) solutions with mechanical breakers or low voltage DC distribution systems, typically up to 1000V DC, such as that shown in FIG. 1. Currently, there are limited options available for high voltage static DC switches for use in marine and offshore systems. High voltage equivalents, typically for operation at 10 to 15 kV are not available. Where two independently operating power systems are required to meet classification standards, there is a need for very fast disconnection of DC bus tie connections to prevent faults from propagating from one side to another. Existing low voltage bus tie switches are not able to operate at voltages above 1000V and certainly not for voltage in the region of 10 to 15 kV or higher.

The example of FIG. 1 is a diesel electric propulsion system based on low voltage DC distribution and comprises a plurality of diesel engines 1, each connected to a generator G1, G2, G3, G4 within respective generator protections systems P1, P2, P3, P4. The generator protection systems include a generator cubicle K1, K2, K3, K4 incorporating generator control 2. Each generator is coupled to DC main switchboard S1, S2 via line 3 which includes a diode 4 and isolation switch 5. Generators G1 and G2 are coupled to switchboard S1. Generators G3 and G4 are coupled to switchboard S2. From each of the switchboard S1, S2, switches 6 and fuses 7 are provided in lines 8 to inverters 9 between the DC main switchboard and motors 10, or to a shaft generator with motor function, which is coupled to AC auxiliary switchboard A1, A2 via filter 11 and transformer 12. In addition, the DC main switchboard S1, S2 supplies a battery 19 through a DC to DC converter 20. The AC auxiliary switchboard is coupled via bypass 13 and isolation switches 14. The DC main switchboard is connected via bus tie switch 15 comprising an isolation switch 16 and transistor diode arrangement 17 at each side of a di/dt reactor 18.

The example of FIG. 1 may be adapted for high voltage DC distribution by replacing the bus tie switch 15 with a power switching assembly 22 as described hereinafter.

Figure 2A:
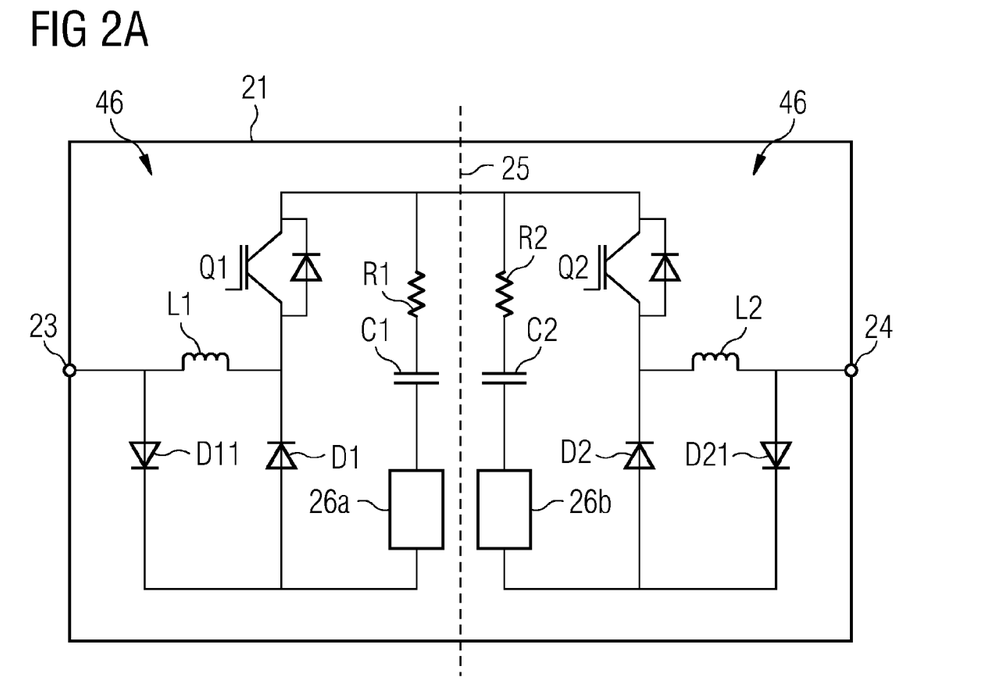
FIG. 2a illustrates a first example of a power switching unit of a power switching assembly according to the invention, suitable for high voltage DC applications.
Figure 2B:
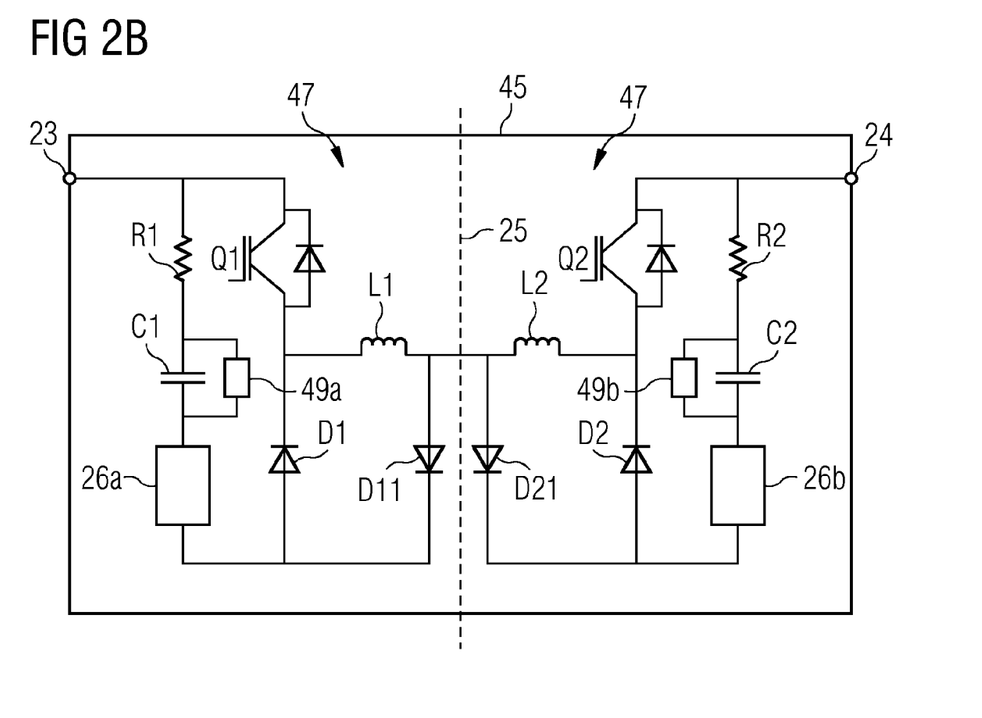
FIG. 2b illustrates a second example of a power switching unit of a power switching assembly according to the invention, suitable for high voltage DC applications.
Figure 3:
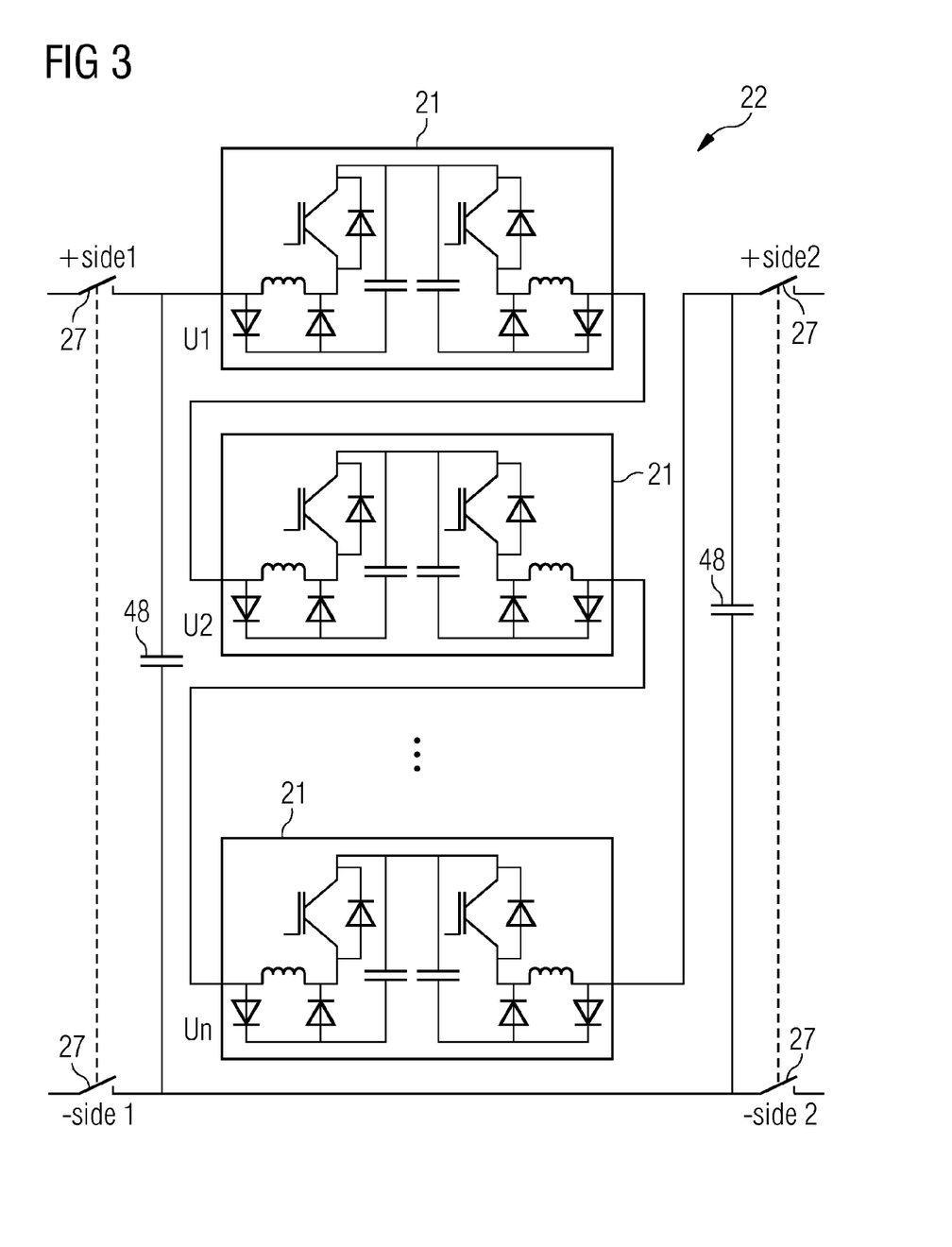
FIG. 3 shows an example topology for a power switching assembly according to the invention.

FIG. 2a illustrates a first example of a power switching unit for a power switching assembly according to the present invention, in particular one that is suitable for use in high voltage DC systems which may be incorporated into the adapted FIG. 1 circuitry. The bus tie switch 15 of FIG. 1 is replaced by a power switching assembly 22, or circuit breaker, of FIG. 3. The power switching assembly 22 comprises a plurality of power switching units 21 as illustrated in FIG. 2a, or FIG. 2b connected together as illustrated in FIG. 3 to form the power switching assembly 22 of FIG. 3.

The power switching assembly provides a high voltage modular DC bus tie switch based on power units 21 that are lifted electrically away from ground potential.

The bus tie switch comprises a plurality of power switching unit modules, which may be easily added or removed according to the required topology for a particular application. Each power unit comprises a first terminal 23 and a second terminal 24, between which is a sub-unit circuit 46 comprising a semiconductor device Q1, typically a diode or transistor, a capacitor C1, diodes D11, D1 and a current limiter, typically an inductance, inductor L1. The first and second terminals are at the same polarity, i.e. either both positive, or both negative. The first and second terminals 23, 24 may be inputs or outputs according to the direction of current flow. The semiconductor device conducts in normal operation. In one embodiment, as shown in FIG. 2a, there is another sub-unit circuit 46 on the other side of symmetry line 25 comprising a semiconductor device circuit Q2, capacitor C2, diodes D21, D2 and a current limiting inductance, inductor L2. If only a one way breaker is required, then only the components on one side of the symmetry line are implemented, according to the desired direction in which the breaker is to operate. For a two way breaker, the components as shown in FIG. 2 on both sides of the symmetry line are implemented. Where a two way breaker is implemented, typically, the sub-units form part of a single power switching unit module, but alternatively, for example on an offshore platform, or vessel, where there are separate fire zones, the sub-units may be arranged to be in adjacent fire zones, coupled together by a DC connection between the two sub-units.

Optionally, one, or each sub-unit circuit 46 may have a resistor R1, R2. One or each sub-unit may have an energy absorbing circuit 26a, 26b, or damper, for example a diode circuit, provided in series with the capacitors. The resistor and damper limit system oscillations and suppress voltage spikes. The damper typically comprises a series connected capacitor and resistor, or series connected inductance and resistor, which are then connected in parallel with a transistor, or diode. Diodes D1, D2 of each sub-unit may be implemented as freewheeling diodes in a transistor. The optional damping circuit 26a, 26b in series with capacitors C1, C2 may be implanted as part of the design of the semiconductor device.

The transistor diode circuits Q1, Q2 conduct current when the circuit breaker 22 is in the ON state. If a short circuit occurs on one side of the system, then according to the direction of the short circuit, the appropriate one of inductor L1, L2 limits the short circuit derivative, rate of change of current, di/dt and when the breaker opens, one of the transistor diode circuits Q1, Q2 turns off. The current previously passing through inductor L1, L2 goes through the freewheeling diodes D1, D11 or D2, D21 until the inductor has discharged and one of the capacitors C1, C2 blocks the voltage when Q1, Q2 turns off. The resistor R1, R2 damps the LC oscillation circuit when the transistors are turned off and also limits the capacitor discharge current when Q1, Q2 turns on. If the short circuit occurs on the other side of the system, then the other one of each of the mirror components comes into operation. The optional resistors may be implemented as internal serial resistance in the capacitors C1, C1 or external resistors R1, R2. The inductance in the oscillation circuit is typically the product of the number, n, of units 21, plus the stray inductance in the full series of units connected from the closest voltage source or capacitor bank, as illustrated in more detail in FIG. 4.

FIG. 2b illustrates a second example of a power switching unit for a power switching assembly according to the present invention, in particular one that is suitable for use in high voltage DC systems which may be incorporated into the adapted FIG. 1 circuitry. The bus tie switch 15 of FIG. 1 is replaced by a power switching assembly 22, or circuit breaker, of FIG. 3. The power switching assembly 22 comprises a plurality of power switching units 45 as illustrated in FIG. 2b connected together as illustrated in FIG. 3 to form the power switching assembly 22 of FIG. 3.

As in the FIG. 2a example, modular DC bus tie switching is based on power switching units which comprises a first terminal 23 and a second terminal 24 between which is a circuit 47 comprising a semiconductor device Q1, typically a diode or transistor, a capacitor C1, diodes D11, D1 and a current limiting inductance, inductor L1. The first and second terminals 23, 24 may be inputs or outputs according to the direction of current flow. In the embodiment shown in FIG. 2b, there is another circuit 47 on the other side of symmetry line 25 comprising a semiconductor device circuit Q2, capacitor C2, diodes D21, D2 and a current limiting inductance, inductor L2. If only a one way breaker is required, then only the components on one side of the symmetry line are implemented, according to the desired direction in which the breaker is to operate. For a two way breaker, the components as shown in FIG. 2b on both sides of the symmetry line are implemented.

Optionally, each circuit 47 may have a resistor R1, R2 and may also have a damping circuit 26a, 26b provided in series with the capacitors C1, C2. The resistor and damping circuit limit system oscillations. Alternatively, a damping circuit 49a, 49b may be provided in parallel with the capacitors, as illustrated in the example of FIG. 2b. In some embodiments, both series and parallel damping circuits 26a, 26b, 49a, 49b may be provided. These are equally applicable to the FIG. 2a example. The, or each, damper 26a, 26b, 49a, 49b may comprise a series connected capacitor and resistor, or a series connected inductor and resistor, which may be connected in parallel with a transistor, or diode; or a series connected capacitor and diode, with a resistor in parallel with the capacitor. The optional damper 26a, 26b, 49a, 49b in series, or parallel, with capacitors C1, C2 may be implanted as part of the design of the semiconductor device. Diodes D1, D2 may be implemented as freewheeling diodes in a transistor.

The transistor diode circuits Q1, Q2 conduct current when the circuit breaker 22 is in the ON state. If a short circuit occurs on one side of the system, then according to the direction of the short circuit, one of inductor L1, L2 limits the short circuit derivative, rate of change of current, di/dt and when the breaker opens, one of the transistor diode circuits Q1, Q2 turns off. The current previously passing through inductor L1, L2 goes through the freewheeling diodes D1, D11 or D2, D21 and one of the capacitors C1, C2 blocks the voltage when Q1, Q2 turns off. The resistor R1, R2 damps the LC oscillation circuit when the transistors are turned off and also limits the capacitor discharge current when Q1, Q2 turns on. If the short circuit occurs on the other side of the system, then the other one of each of the mirror components comes into operation.

The structural arrangement of the FIG. 2b example differs from the example of FIG. 2a in that in FIG. 2b the terminal of the transistor diode circuit which is connected to the capacitor is also connected to the terminal 23, 24 of the power switching unit, whereas in FIG. 2a that terminal of the transistor diode circuit was connected to the equivalent terminal of the transistor diode circuit in other sub-unit. In FIG. 2a, it was the terminal of the transistor diode circuit that connected to the current limiter and series connected diodes that were connected to the terminal of the unit. As in the FIG. 2a example, the optional resistors may be implemented as internal serial resistance in the capacitors C1, C1 or external resistors R1, R2. The inductance in the oscillation circuit is typically the product of the number, n, of units 21, plus the stray inductance in the full series of units connected from the closest voltage source or capacitor bank, as illustrated in more detail in FIG. 4.

Typically, a plurality of units 21, 45 are connected together in series as in FIG. 3 and then connected into the power supply system between the two sides S1, S2 of the DC main switchboard. The arrangement of FIG. 3 means that the power units 21, 45 are only connected between the two sides of the DC bus in one polarity, i.e. at the positive. This makes the construction less complex and easier to build. If a low inductance capacitor bank is connected to the DC bus bar outside the power switching assembly 22, then there is no need to connect power units between the negative poles of each side of the DC bus, but as an additional precaution optionally capacitor banks 48 may be connected across the poles on either or both of side 1 and side 2. An optional resistor (not shown), or damper circuit (not shown) of the type described with respect to FIG. 2 may be added in series with the capacitance 148.

Any number of serial connected units as indicated as −U1, U2 . . . Un, may be used, where Un may be an infinite unit number. Mechanical switches 27 are provided at side 1 and side 2 of the positive and negative poles and these switches provide galvanic separation between the two sides of the power switching assembly 22 to block stray currents from being transmitted from one side to the other. These units are largely self contained, avoiding the need for external inductance to protect them from current spikes and so removing a potential source of short circuits within the assembly.

Figure 4:
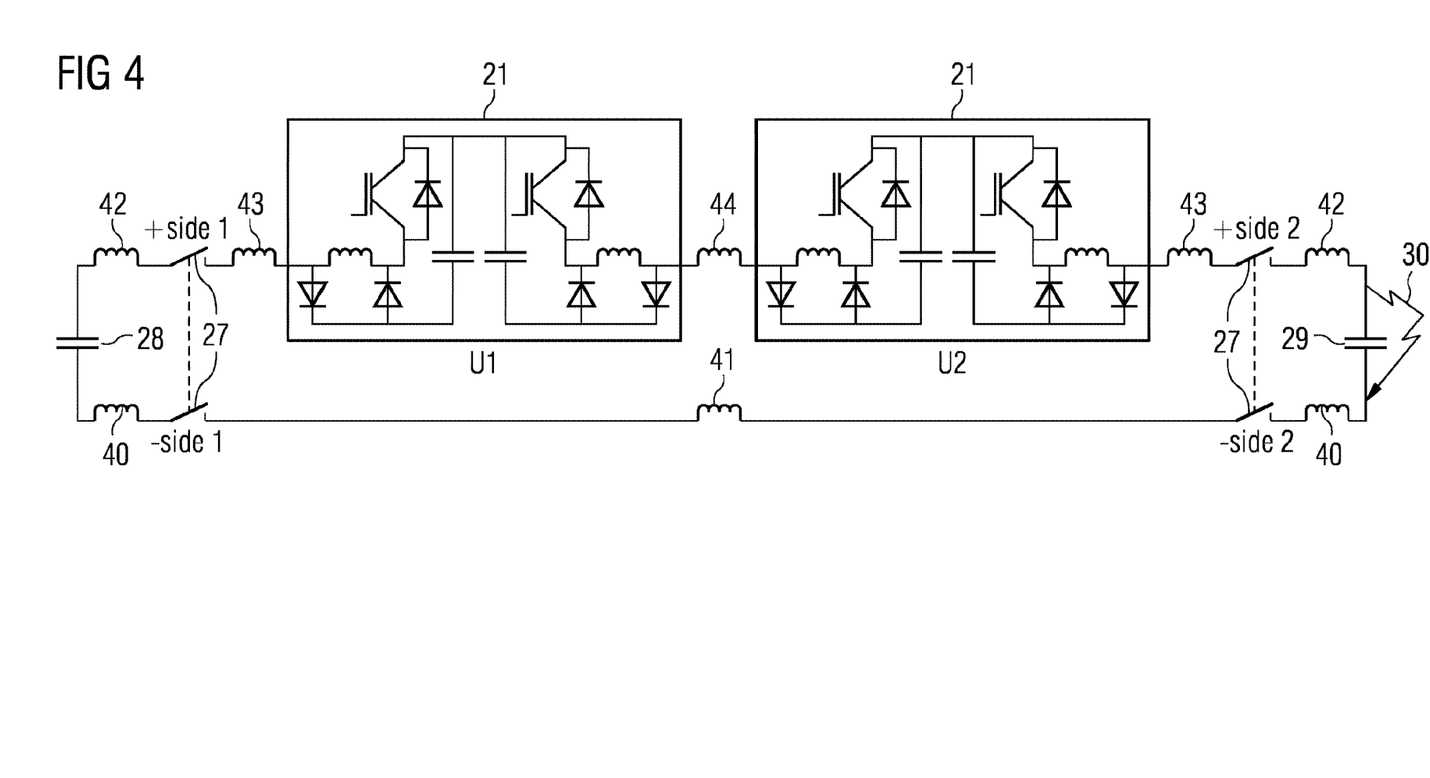
FIG. 4 is an electrical equivalent circuit for the power switching assembly of FIG. 3.
Figure 5A:
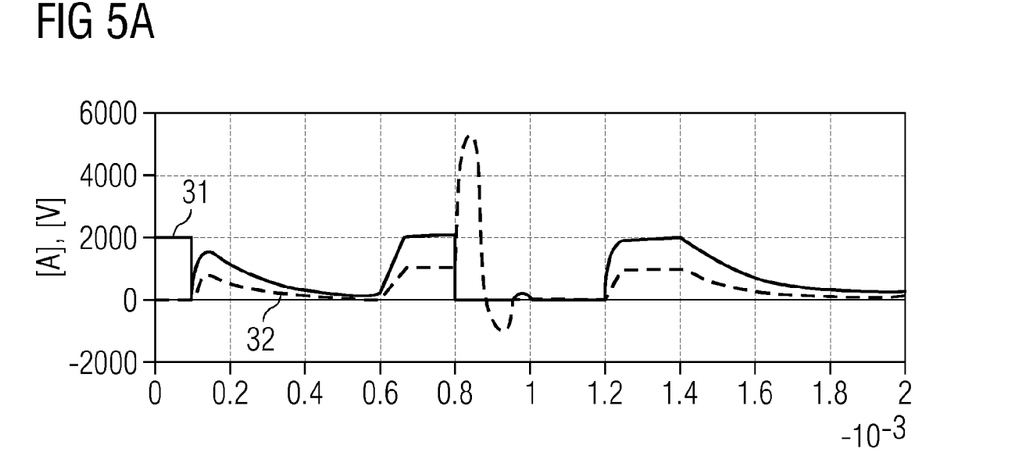
FIG. 5a illustrates current and voltage curves against time, for the example of FIG. 3.
Figure 5B:
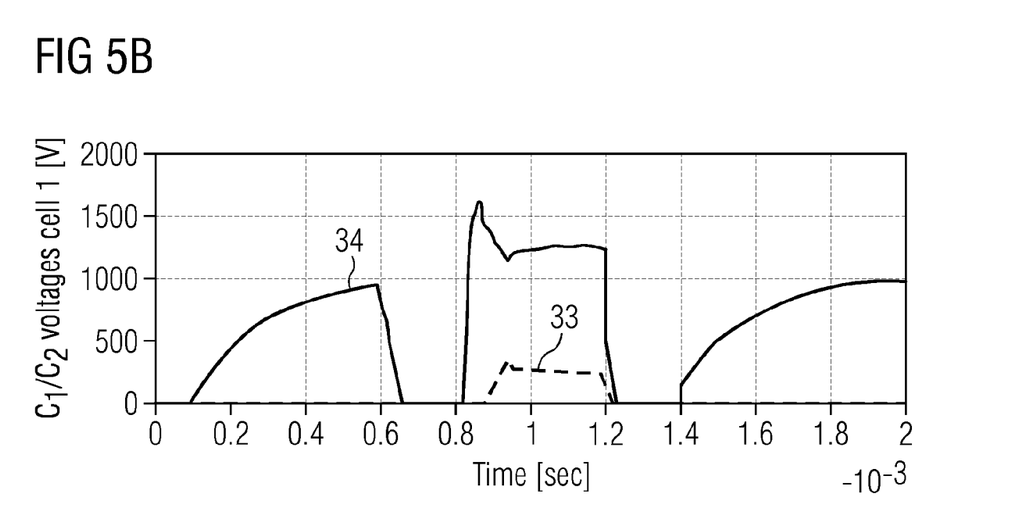
FIG. 5b illustrates voltage at capacitor C1 and C2 against time, for the example of FIG. 3.

FIG. 4 illustrates an electrical equivalent of the power switching assembly of FIG. 3, for a power switching assembly according to the invention comprising power switching units 21, as illustrated in FIG. 2a, but the power switching units may equally well be those of the FIG. 2b example, as the modelled results in FIGS. 5a and 5b apply for either example of the units 21, 45. On the negative pole, there is stray inductance 40 at side 1 and side 2, as well as stray inductance 41 between the mechanical switches 27. On the positive pole, there is stray inductance 42 at side 1 and side 2, as well as stray inductance 43 between the mechanical switches 27 and each of the power units 21 and also stray inductance 44 between the two power units. The input 28 from side 1 and the input 29 from side 2 are treated as a large capacitor or voltage source. In the event of a failure on side 1 or side 2 of the DC power supply system, such as a short circuit 30, shown in this example on side 2, there is no interruption to the stable voltage on the other side of the system, in this example, side 1.

An example of current and voltage from a simulation of a power switching assembly 22 having two power units 21 connected in series and a 2000 V DC voltage source on side 1 is shown in FIGS. 5a and 5b. In FIG. 5a, curve 31 represents the variation of current on side 2, with time, the side with the fault, or failure and curve 32 represents the variation of DC voltage on side 2, with time. FIG. 5b shows the voltage on the power unit itself. Curve 33 represents DC voltage across capacitor C1 in the power unit 21 and curve 34 represents the DC voltage across capacitor C2 in power unit. The voltage build up is the same for all the units 21, as they are in series.

Initially, the circuit breaker is open and the voltage 31 is high on side 2 due to transistor or diode leakage impedance. The current 32 on side 2 is initially zero and there is no DC voltage 33, 34 across the capacitors of power unit U1. At time 0.1 ms, a 2 MW load is connected, the breaker is still open, but on side 1 the capacitors in the power unit 21 start to charge to ½ of the full voltage source each, i.e. 1000V, as there are two units in series. DC voltage 31 drops to zero and then both voltage 31 and current 32 on side 2 start to rise. At about 0.15 ms, the voltage 31 and current 32 start to tail off and drop to zero by 0.6 ms. Between 0.1 ms and 0.6 ms voltage 34 across capacitor C2 rises to close to 1 KV, but voltage 33 across C1 remains at zero.

At time 0.6 ms, the effect of the circuit breaker closing is illustrated. The voltage 34 in the capacitor banks drops to zero, controlled by the unit inductance and capacitor series resistor. Voltage 33 across C1 remains at zero, whilst voltage 31 and current 32 on side 2 both rise initially, then level off. At time 0.80 ms the effect of a short circuit on side 2 is illustrated, in which an ideal breaker is immediately closed, dropping voltage 31 on side 2 to zero and causing a spike in current 32 on side 2. Very shortly afterwards, shown as at time 0.82 ms, the breaker opens, the control system detects the short circuit and the control system opens the transistors. The voltage 34 across capacitor C2 peaks, then begins to tail off towards 1 KV, whilst the voltage 33 begins to rise to a value below 500 V, following a similar pattern. At the same time, the current 32 on side 2 drops below zero and the voltage 31 remains at zero.

At time 0.95 ms the short circuit is cleared and the breaker opens, returning current 32 and voltage 31 to zero and levelling off the voltages 33, 34 across the capacitors. At time 1.20 ms, the breaker closes, the load is still connected and the capacitors in the units discharge to zero, whilst the current 32 and voltage 31 on side 2 rise and level off. At time 1.4 ms, the breaker opens, the voltage 34 climbs and the capacitors in the units charge. The voltage 31 and current 32 tail off towards zero. In the example shown, the voltage climbs to 1 KV from time 1.4 ms, but the current is limited to a value below 6000 A, so the components, in particular the transistors and diodes, are not overstressed by a fault occurring. The extent to which the current can rise without damage depends upon the voltage and component rating in the power switching units. The voltage blocking effect of the semiconductor devices is also beneficial in protecting the components at high voltages.

Figure 6:
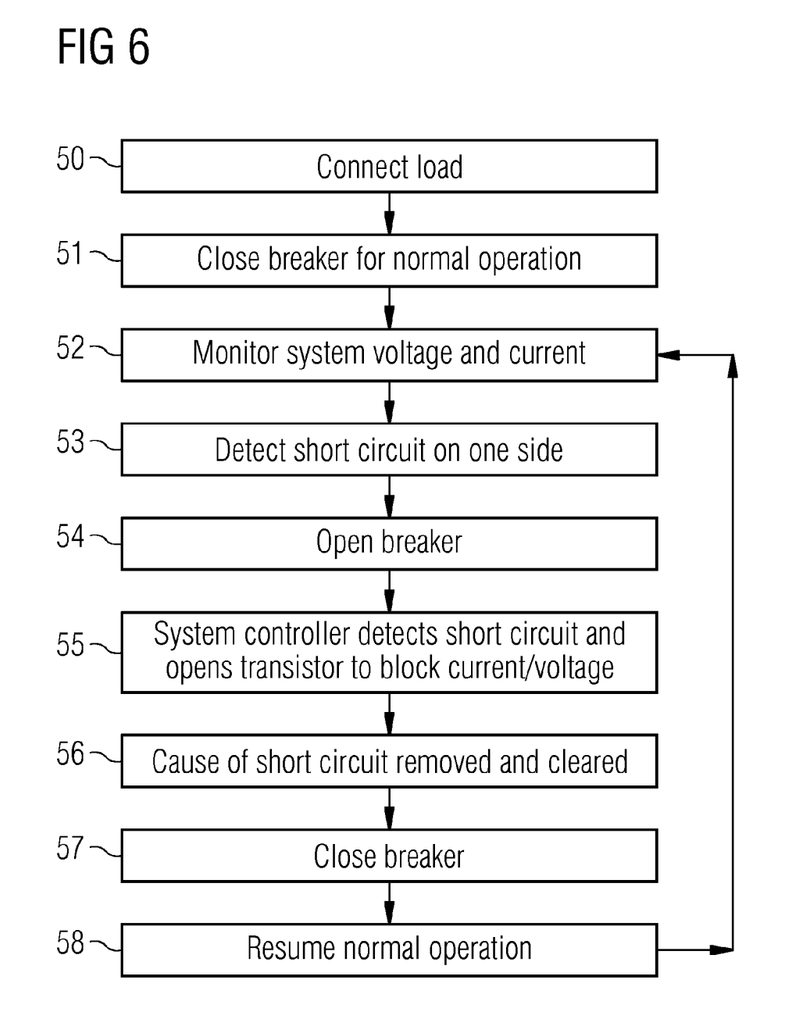
FIG. 6 is a flow diagram of a method of operation of a power switching assembly according to the invention.

FIG. 6 is a flow diagram showing an example of a method of operation of a DC power switching assembly according to the invention. A load may be connected 50 to the circuit and the bus tie switches of the power switching assembly 22 are set to be closed 51, for normal operation. In normal operation, transistor diode circuitry within the sub-unit conducts. A system controller (not shown) monitors 52 system voltage and current during operation. Upon detection 53 of a short circuit on one side of the power switching assembly 22, the controller causes the breakers to open 54 and opens 55 the transistor diode circuitry within the appropriate sub-unit 46 according to the direction, so that the semiconductor device Q1, Q2 in the sub-unit no longer conducts, to block current, or voltage. If the semiconductor device no longer conducts, the series connected diodes D1, D11 or D2, D21 of the sub-unit allow current flow to continue until the current limiter L1, L2 of the sub-unit has been discharged and a capacitor C1, C2 connected to the other terminal of the semiconductor device blocks voltage. After the cause of the short circuit has been removed 56 and cleared, the system may close 57 the breaker again, closing the transistor diode circuit of the relevant sub-unit to allow current or voltage again and normal operation is resumed 58, with the system controller continuing to monitor 52 current and voltage to determine if another short circuit occurs.

The circuitry of the present invention provides a static DC circuit breaker that may be used for any DC voltage level based on generally available components and in particular may be used at high voltage levels, i.e. above 1000V, in the range 1 kV to 10 kV, in the range 1 kV to 15 KV, or even well above 15 KV. Although, the examples have been given for two series connected power switching units, for any required voltage, a number of power switching units in series is chosen to make up the power switching assembly by splitting the total voltage requirement substantially equally across all the units, taking account of the voltage at which each unit is rated to operate. The currently advantageous voltages are around 10 KV to 15 KV, but the modular approach enables operation at 100 KV to be achieved by adding further units.

The invention claimed is:

1. A DC power supply system, comprising:
first and second DC power distribution bus sections and a DC power switching assembly wherein a first terminal of the assembly is electrically coupled to the first DC bus section of the power distribution bus and a second terminal is electrically coupled to the second DC bus section of the power distribution bus;
wherein the DC power switching assembly comprises a plurality of series connected power switching units; each power switching unit comprising a first terminal of the unit having an electrical positive and an electrical negative pole and a second terminal of the unit having an electrical positive and an electrical negative pole and a power switching sub-unit electrically coupled between the first terminal and the second terminal to control current flow between the first terminal and the second terminal;
wherein the first terminal and the second terminal have the same polarity of the pole, either positive or negative;
wherein the sub-unit comprises at least one semiconductor device, which conducts in normal operation and no longer conducts in the event of a fault arising at one of the first and second terminals, a current limiter and a pair of series connected diodes in parallel with the current limiter, wherein the series connected diodes and current limiter are connected to one terminal of the semiconductor device;
wherein the series connected diodes allow current flow to continue until the current limiter has discharged, if the semiconductor device no longer conducts; and
wherein a voltage blocking capacitor is connected to the other terminal of the semiconductor device to block voltage when the semiconductor devices no longer conduct.

2. The system according to claim 1,
wherein the assembly comprises two symmetrical power switching sub-units, each unit being connected on one side to one of the first and second power switching unit terminals and on the other side to the other sub-unit.

3. The system according to claim 1,
wherein the capacitor is connected in parallel across the semiconductor device.

4. The system according to claim 1,
wherein one or each of the sub-units further comprise a resistor in series with the capacitor.

5. The system according to claim 1,
wherein one or each of the sub-units further comprise a damping circuit in series with the capacitor.

6. The system according to claim 1,
wherein the semiconductor device comprises one of a diode, or a transistor.

7. The system according to claim 1,
wherein the semiconductor device comprises an insulated gate bipolar transistor.

8. The system according to claim 1,
wherein the current limiter comprises an inductance.

9. The system according to claim 1,
wherein the voltage at one side of the power switching assembly is greater than or equal to 1 KV.

10. The system according to claim 1, wherein the voltage at one side of the power switching assembly is within the range 1 KV to 15 KV.

11. A method of operating a DC power switching assembly of a system according to claim 1, the method comprising:
- monitoring system voltage and current during operation for an indication of a short circuit;
- upon detection of the indication of the short circuit, opening the power switching units to block current from the short circuit side of the system;
- monitoring for an indication that the short circuit has been cleared, and upon detection of the indication that the short circuit has been cleared, closing the power switching units to allow current to pass through the power switching units; and
- continuing to monitor the system for the indication of a short circuit.

* * * * *